US012633352B2

(12) United States Patent
Yano

(10) Patent No.: US 12,633,352 B2
(45) Date of Patent: May 19, 2026

(54) MEMORY DEVICE CAPABLE OF OPERATING MULTIPLE PLANES SIMULTANEOUSLY

(71) Applicant: Winbond Electronics Corp., Taichung City (TW)

(72) Inventor: Masaru Yano, Kanagawa (JP)

(73) Assignee: Windbond Electronics Corp., Taichung City (TW)

( * ) Notice: Subject to any disclaimer, the term of this patent is extended or adjusted under 35 U.S.C. 154(b) by 553 days.

(21) Appl. No.: 18/181,577

(22) Filed: Mar. 10, 2023

(65) Prior Publication Data
US 2023/0326533 A1 Oct. 12, 2023

(30) Foreign Application Priority Data
Mar. 24, 2022 (JP) ................................. 2022-047805

(51) Int. Cl.
*G11C 16/26* (2006.01)
*G11C 7/10* (2006.01)
*G11C 16/10* (2006.01)
*G11C 16/34* (2006.01)
*G11C 29/52* (2006.01)
(52) U.S. Cl.
CPC ............ *G11C 16/26* (2013.01); *G11C 7/1096* (2013.01); *G11C 16/3459* (2013.01); *G11C 29/52* (2013.01)
(58) Field of Classification Search
CPC ... G11C 16/26; G11C 7/1096; G11C 16/3459; G11C 29/52; G11C 7/1084; G11C 16/0483; G11C 2029/0411; G11C 16/10; G11C 16/08; G06F 3/0659; G06F 3/0679
See application file for complete search history.

(56) References Cited

U.S. PATENT DOCUMENTS

| | | | |
|---|---|---|---|
| 2005/0172086 A1* | 8/2005 | Kawai ................ | G11C 16/3418 711/154 |
| 2007/0002621 A1* | 1/2007 | Park .................. | G11C 16/0483 365/185.11 |
| 2008/0229000 A1* | 9/2008 | Kim ...................... | G11C 16/10 714/48 |
| 2009/0034334 A1 | 2/2009 | Furuyama et al. | |

(Continued)

FOREIGN PATENT DOCUMENTS

| | | |
|---|---|---|
| CN | 111656371 | 9/2020 |
| JP | H10144892 | 5/1998 |

(Continued)

OTHER PUBLICATIONS

"Office Action of Taiwan Counterpart Application", issued on Nov. 17, 2023, p. 1-p. 5.

*Primary Examiner* — Jay W. Radke
(74) *Attorney, Agent, or Firm* — JCIPRNET

(57) ABSTRACT

Disclosed is a flash memory, which includes: a memory cell array including two planes; a controller configured to control the read action and program action of the two planes; and two latches configured to hold data read from one plane or data that should be programmed to one plane; and two latches configured to hold data read from another plane or data that should be programmed to another plane. The controller is configured to perform read operation of the other plane according to a simultaneous command input from the outside while performing programming operation of one plane.

20 Claims, 9 Drawing Sheets

(56) References Cited

U.S. PATENT DOCUMENTS

| | | | | |
|---|---|---|---|---|
| 2009/0157964 A1* | 6/2009 | Kasorla | ............... | G06F 12/0246 |
| | | | | 711/E12.002 |
| 2010/0042774 A1* | 2/2010 | Yang | ................... | G06F 12/0246 |
| | | | | 711/E12.001 |
| 2011/0161567 A1* | 6/2011 | Song | ................... | G06F 12/0246 |
| | | | | 711/E12.001 |
| 2012/0020161 A1* | 1/2012 | Haukness | ........... | G06F 12/0246 |
| | | | | 365/189.16 |
| 2012/0151161 A1* | 6/2012 | Jung | ...................... | G11C 29/82 |
| | | | | 711/E12.002 |
| 2012/0268993 A1* | 10/2012 | Park | ........................ | G11C 16/10 |
| | | | | 365/185.11 |
| 2016/0147460 A1* | 5/2016 | Sohn | ..................... | G06F 9/3004 |
| | | | | 711/165 |
| 2018/0314635 A1* | 11/2018 | Alam | ..................... | G11C 16/22 |
| 2021/0142838 A1* | 5/2021 | Pan | ..................... | G11C 11/2255 |
| 2021/0166764 A1 | 6/2021 | Hong et al. | | |
| 2022/0270691 A1* | 8/2022 | Tamura | ............... | G11C 11/5628 |
| 2023/0236969 A1* | 7/2023 | Muthiah | ............... | G06F 3/0679 |
| | | | | 711/103 |

FOREIGN PATENT DOCUMENTS

| | | | | | |
|---|---|---|---|---|---|
| JP | 2007012240 A | * | 1/2007 | ............. | G11C 16/06 |
| JP | 2009032324 | | 2/2009 | | |
| JP | 6178909 | | 8/2017 | | |
| JP | 6770140 | | 10/2020 | | |
| TW | 200631023 | | 9/2006 | | |
| TW | 202107304 | | 2/2021 | | |

* cited by examiner

Input the command and address for reading the plane P0 ~S10

Read the data D1 from the plane P0, and output the read data D1 to the outside ~S20

Input the program command, address, and data D1 for the plane P1 ~S30

Program the data D1 to the plane P1 ~S40

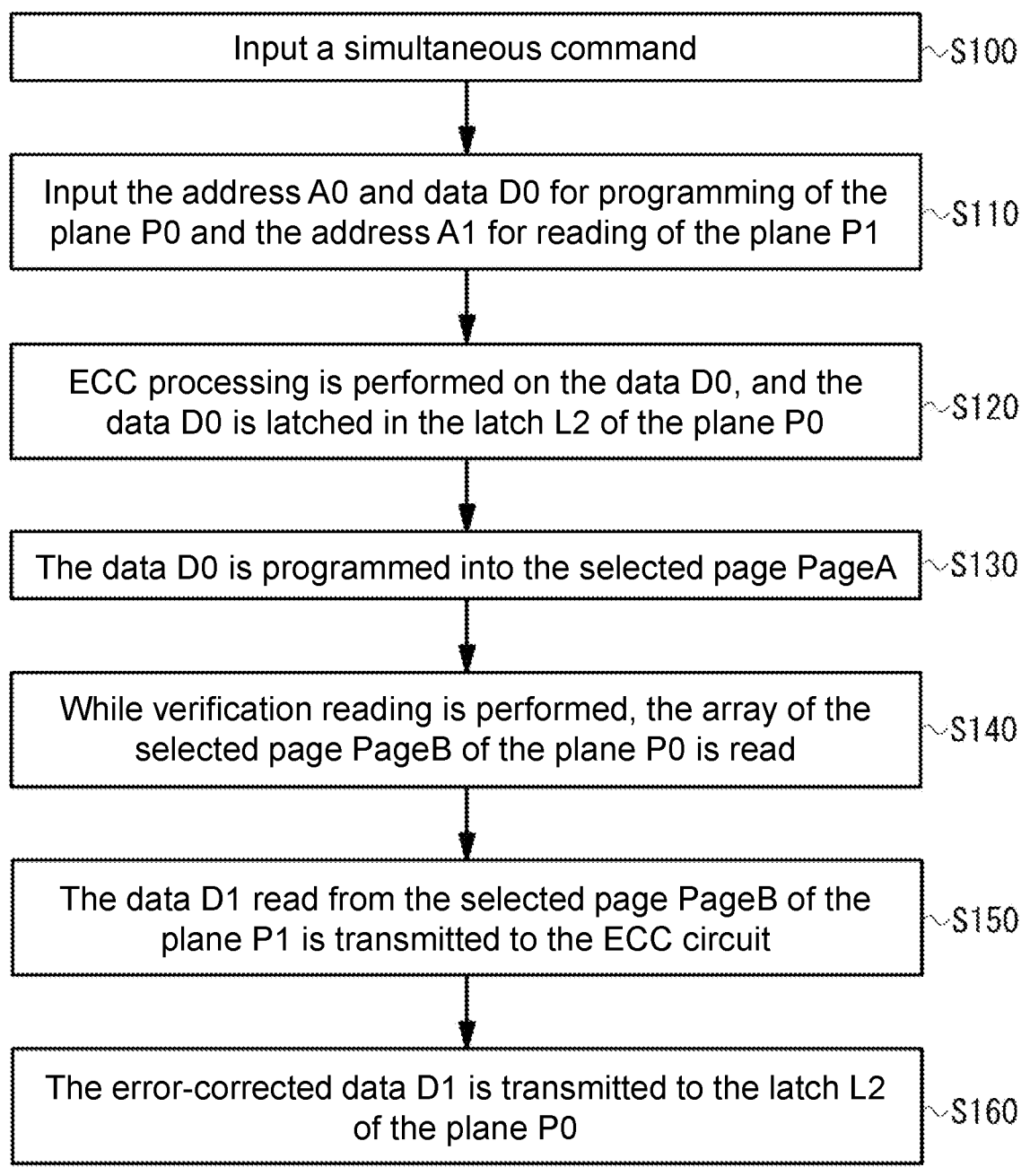

| Input a simultaneous command | ~S100 |

| Input the address A0 and data D0 for programming of the plane P0 and the address A1 for reading of the plane P1 | ~S110 |

| ECC processing is performed on the data D0, and the data D0 is latched in the latch L2 of the plane P0 | ~S120 |

| The data D0 is programmed into the selected page PageA | ~S130 |

| While verification reading is performed, the array of the selected page PageB of the plane P0 is read | ~S140 |

| The data D1 read from the selected page PageB of the plane P1 is transmitted to the ECC circuit | ~S150 |

| The error-corrected data D1 is transmitted to the latch L2 of the plane P0 | ~S160 |

FIG. 4

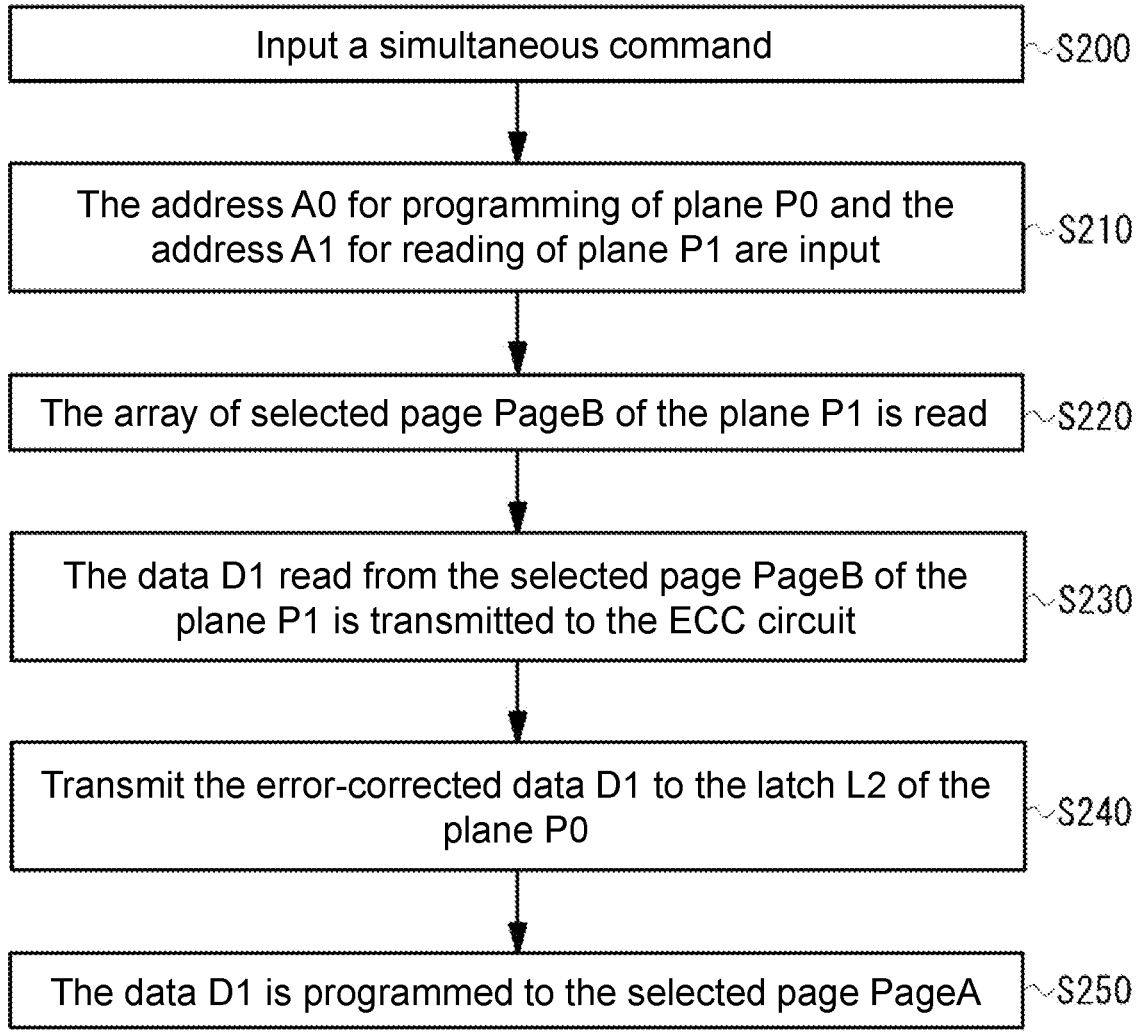

| Input a simultaneous command | ~S200 |

| The address A0 for programming of plane P0 and the address A1 for reading of plane P1 are input | ~S210 |

| The array of selected page PageB of the plane P1 is read | ~S220 |

| The data D1 read from the selected page PageB of the plane P1 is transmitted to the ECC circuit | ~S230 |

| Transmit the error-corrected data D1 to the latch L2 of the plane P0 | ~S240 |

| The data D1 is programmed to the selected page PageA | ~S250 |

FIG. 8

MEMORY DEVICE CAPABLE OF OPERATING MULTIPLE PLANES SIMULTANEOUSLY

CROSS-REFERENCE TO RELATED APPLICATION

This application claims the priority benefit of Japan application serial no. 2022-047805, filed on Mar. 24, 2022. The entirety of the above-mentioned patent application is hereby incorporated by reference herein and made a part of this specification.

BACKGROUND

Field of the Disclosure

The present disclosure relates to a semiconductor device such as a flash memory, and more particularly to a flash memory including a plurality of planes with improved data processing efficiency.

Description of Related Art

In a NAND flash memory, storage capacity may be increased by increasing the number of blocks formed in a memory cell array. However, if the number of blocks is increased, the wiring of the main bit lines extending in the direction of the blocks becomes longer, which increases the load capacity and slows down the reading speed and the like. Therefore, in order to increase the storage capacity and suppress the load capacity of the main bit line, the memory cell array is divided into a plurality of planes in conventional technology.

Japanese Laid-Open Publication No. 6178909 discloses a method for sequentially reading pages of a NAND flash memory including multiple planes. Specifically, the data read from the selected plane is held in the latches, the data held in the latches is transmitted to the latches of the non-selected plane, and the latches of the selected plane and the latches of unselected planes are pipelined, thereby achieving high-speed continuous reading. In addition, the technology disclosed in Japanese Laid-Open Publication No. 6770140 is able to suppress generation of unnecessary current flowing through NAND strings in non-selected planes.

In a multi-plane flash memory, each plane has a corresponding block decoder/driver circuit, row drive circuit X_DRV, page buffer/sensing circuit, and these planes may share a controller or an input/output circuit. The controller selects one or more planes from a plurality of planes based on input address information, so as to control operations such as reading, programming, and erasing of the selected planes.

FIG. 1 shows a schematic structure of a flash memory having two planes P0 and P1. This figure illustrates that plane P0 and plane P1 each includes blocks block(n−1, n, n+1), row drive circuits X_DRV(n−1, n, n+1) driving word lines of these blocks, and drive control circuit 10A (or 10B) that drives bit line side selection transistors and source line side selection transistors of these blocks. The drive control circuits 10A and 10B output the selection signal SGS for driving the source line side selection transistors of NAND strings and the selection signal SGD for driving the bit line side selection transistors of the NAND strings.

For example, in a read operation, the plane P0 is a selected plane, and the plane P1 is a non-selected plane, and a selected block n of the plane P0 is read. In this case, based on the decoding result of a row address, the block decoder (not shown) commonly outputs a block selection signal BSELn for selecting block n to the row drive circuit X_DRVn of the selected plane P0 and the row drive circuit X_DRVn of the non-selected plane P1. In this way, the pass transistors of the row drive circuit X_DRVn of the selected plane P0 and the non-selected plane P1 are turned on.

In the selected plane P0, the row drive circuit is driven by the drive control circuit 10A such that it applies a turn on voltage to the bit line selection transistor and to the source line side selection transistor, applies a ground (GNd) voltage to a selected word line, and applies a read pass voltage Vpass to non-selected word lines. The data of a selected page is read by the page buffer/sensing circuit (not shown) of the selected plane P0 and output to the outside through an input and output circuit.

In the non-selected plane P1, although the pass transistor of its row drive circuit X_DRVn is turned on, the selection signals SGS and SGD output by the drive control circuit 10B may turn off the bit line side selection transistor and the source line side selection transistor, so that the non-selected plane P1 is not affected by the operation of the selected plane P0.

In the existing multi-plane NAND flash memory, during the operation on the selected plane, it is impossible to operate the non-selected plane. For example, if it is desired to program plane P0 and read plane P1, it would be necessary to input program commands, addresses, and data for plane P0 to the existing multi-plane NAND flash memory, and after programming of plane P0 is completed, it is required to input a read command and an address for plane P1 additionally. In another example, if it is desired to program plane P0 as well as program plane P1, it would be necessary to input program commands, addresses and data for plane P0 to the existing multi-plane NAND flash memory, and then input program commands, addresses and data for plane P1. As described above, when performing operations on multiple planes, the processing efficiency might not be sufficient.

Also, in neuromorphic chips and the like, high-speed product-sum calculation processing is required for learning and weighting processing. The product-sum operation process is performed by repeatedly adding or multiplying data obtained by adding or multiplying data such as matrix operations to the next data. Therefore, in terms of the host side, it is ideal that the processed data or the data to be processed is on the same plane in order to perform rapid calculation processing, thereby limiting the storage capacity.

On the other hand, the flash memory is equipped with functions such as copyback which allows internal transmission of the storage location of data. However, the copyback function is performed only in the same plane and is unable to be used for data transmission across planes.

For example, in order to transmit the data stored in the plane P0 to the plane P1, the data read from the plane P0 is required to be temporarily output to the outside, and then the read data is input from the outside and programmed into the plane P1.

FIG. 2 shows an operation flow when transmitting data across planes. The host side inputs the command and address for reading the plane P0 (S10), reads the data D1 from the plane P0, and outputs the read data D1 to the host side (S20). Next, the host side inputs the program command, address, and data D1 for the plane P1 (S30), and the data D1 is programmed to the plane P1 (S40). As described above, in the conventional multi-plane flash memory, it takes time to transmit data between planes, and the processing on the host side is also complicated.

SUMMARY

A purpose of the present disclosure is to solve the existing problems described above, and to provide a memory device having multiple planes with improved data processing efficiency.

The memory device of the disclosure includes: a memory cell array comprising a first plane and a second plane; a control circuit configured to control a read operation and a program operation of the first plane and the second plane; a first data holding circuit configured to hold data read from or to be programmed to the first plane; and a second data holding circuit configured to hold data read from or to be programmed to the second plane. The control circuit holds read data read from the second plane in the second data holding circuit, and transmits the read data held by the second data holding circuit to the first data holding circuit according to a simultaneous command input from the outside.

Further, the memory device of the disclosure includes: a memory cell array, which at least comprises a first plane and a second plane; a control circuit configured to control a read operation and a program operation of the first plane and the second plane; a first data holding circuit configured to hold data read from or to be programmed to the first plane; and a second data holding circuit configured to hold data read from or to be programmed to the second plane. The control circuit is configured to program read data read from the second plane to the first plane according to a simultaneous command input from the outside.

The operating method of the memory device of the disclosure includes: controlling a read operation and a program operation of the first plane and the second plane; holding, by the first data holding circuit, data read from or to be programmed to the first plane; holding, by the second data holding circuit, data read from or to be programmed to the second plane; and operating the first plane and the second plane simultaneously according to a simultaneous command input from the outside, by holding read data read from the second plane in the second data holding circuit, and transmitting the read data held by the second data holding circuit to the first data holding circuit, or programming the read data read from the second plane to the first plane.

In the circuit of the present disclosure, when the first plane is programmed with first data, second data may be simultaneously read from the second plane, so the processing efficiency may be improved by operating multiple planes simultaneously.

BRIEF DESCRIPTION OF THE DRAWINGS

FIG. 4 is a flow chart showing multi-plane simultaneous operation according to a first embodiment of the present disclosure.

FIG. 8 is a flow chart showing multi-plane simultaneous operation according to a fourth embodiment of the present disclosure.

DETAILED DESCRIPTION OF DISCLOSED EMBODIMENTS

The memory device of the present disclosure is, for example, a NAND-type flash memory, or a microprocessor embedded in this type of flash memory, a microcontroller, a processor for processing logic, an application specific integrated circuit (ASIC), an image or a sound, a processor for processing signals such as wireless signals, etc. In addition, the memory device of the present disclosure is equipped with a serial peripheral interface (SPI), and is able to operate synchronously with an external clock signal.

Figure 1:
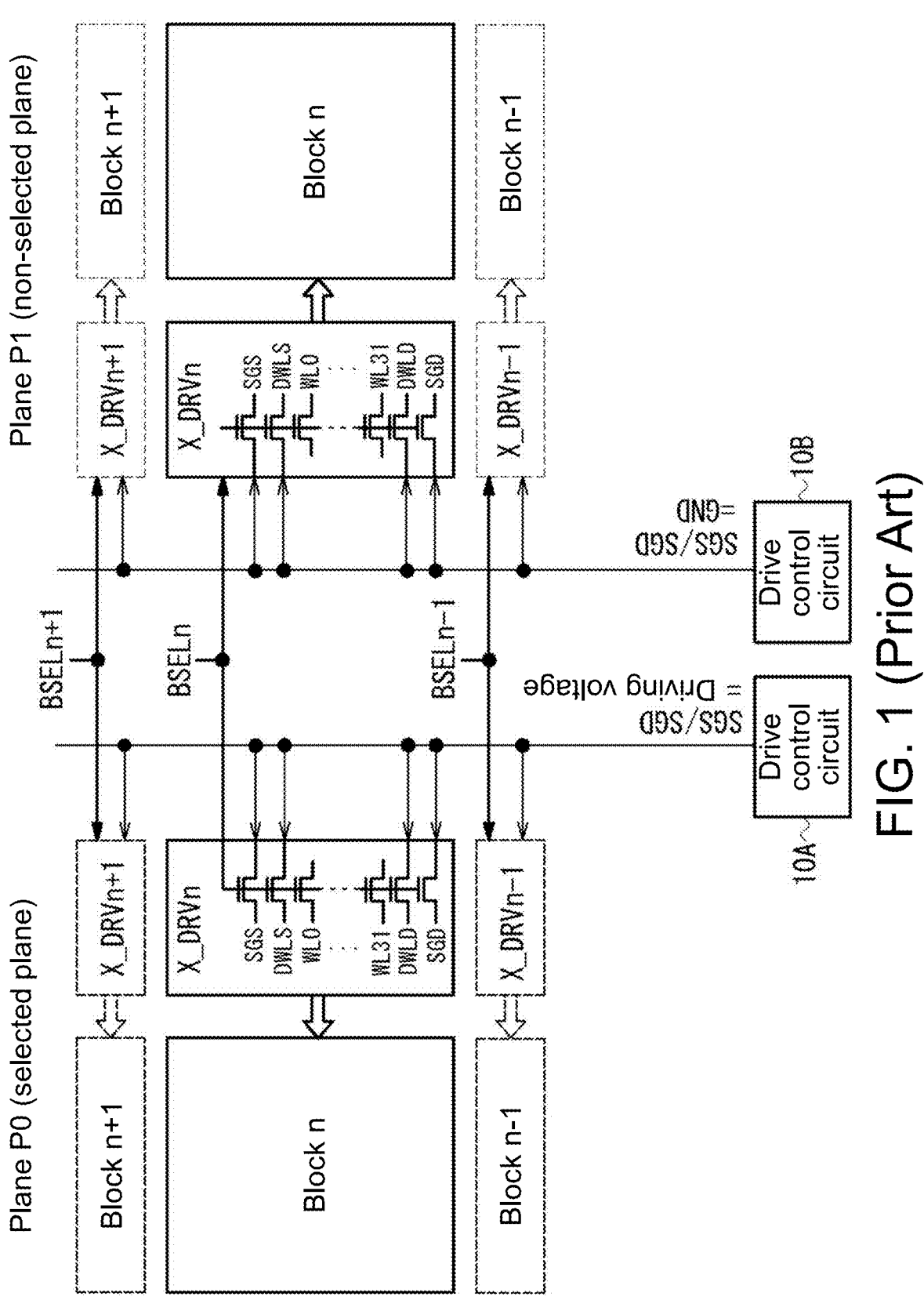
FIG. 1 is a diagram showing a schematic configuration of a conventional multi-plane flash memory.
Figure 2:
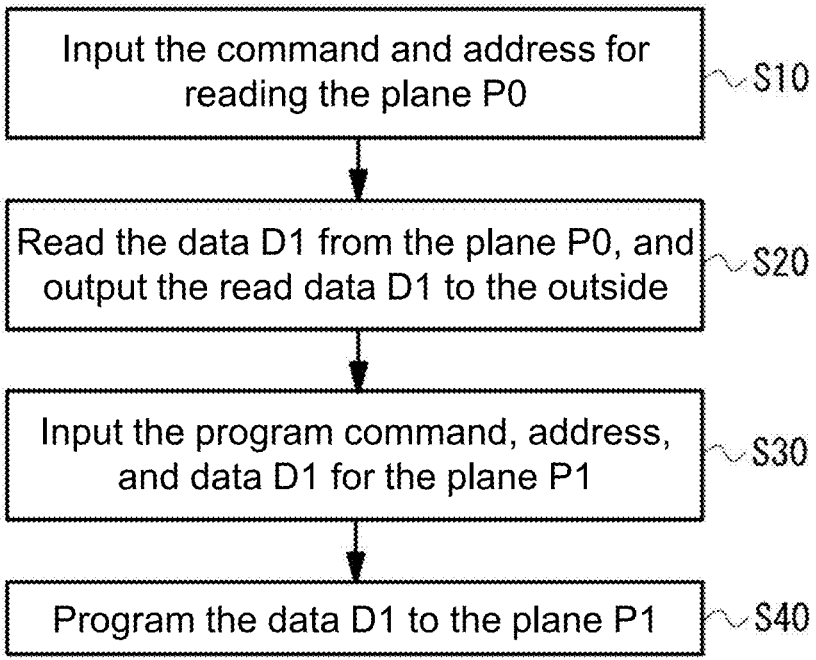
FIG. 2 is a diagram showing a conventional operation flow of transmission of data across planes.
Figure 3:
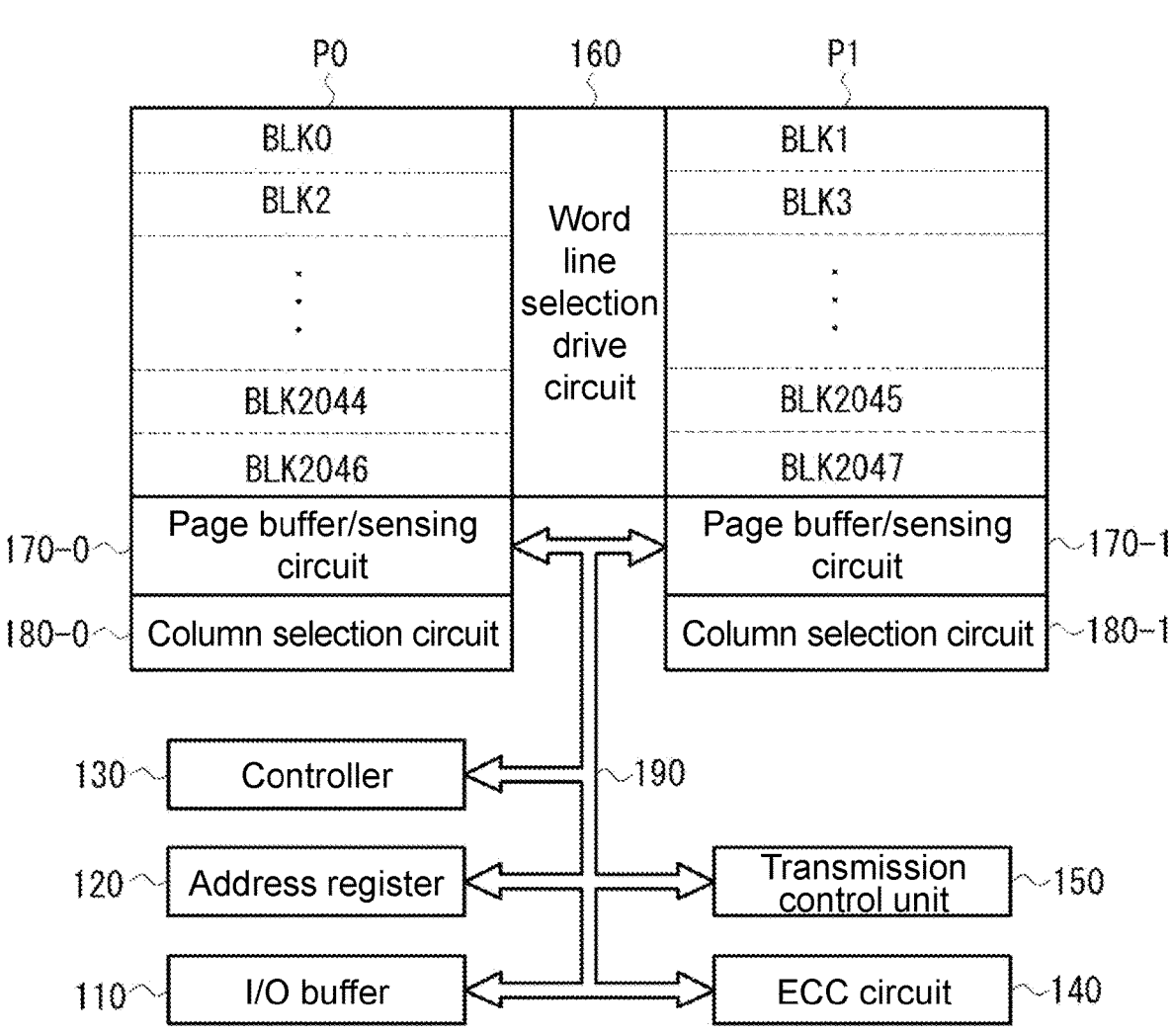
FIG. 3 is a diagram showing the structure of a flash memory according to an embodiment of the present disclosure.

Next, embodiments of the present disclosure will be described with reference to the drawings. As shown in FIG. 3, the flash memory 100 includes: a memory cell array, including two planes P0 and a plane P1 formed with a plurality of memory cells arranged in a matrix; an input-output buffer (I/O buffer) 110, connected to an external input-output terminal I/O; an address register 120, receiving the address data from the I/O buffer 110; a controller 130, controlling the operations of reading, programming and erasing based on the command from the I/O buffer 110 or an external control signal (chip enable CE, command latch enable CLE, address latch enable ALE, ready/busy RY/BY, etc. which are not shown); an error-correcting code (ECC) circuit 140, which performs error detection and correction on data programmed into plane P0 and plane P1 or data read from them; a transmission control unit 150, which controls the data transmission of an internal bus 190; a word line selection drive circuit 160, which selects blocks of plane P0 and plane P1 or selects word lines based on the row address information Ax from the address register 120; a page buffer/sensing circuit 170-0 and a page buffer/sensing circuit 170-1, which hold the data read through the bit line, or hold the data programmed through the bit line, etc.; a column selection circuit 180-0 and a column selection circuit 180-1, which select bit lines based on the column address information Ay from the address register 120; and an internal bus 190, which connects various parts together. In addition, although not shown here, the flash memory 100 includes a voltage generating circuit that generates voltages (program voltage Vpgm, read pass voltage Vpass, read voltage Vread, erase voltage Vers, etc.) required for performing reading, programming and erasing operations.

The plane P0 and the plane P1 are memory arrays formed in physically separated regions, for example, the plane P0 and the plane P1 are respectively formed in separate P-type wells. Planes are also sometimes referred to as memory mats or memory banks. The plane P0 includes a plurality of blocks, and in this example, the plane P0 includes 1024 even-numbered blocks (BLK0, 2, . . . , 2044, 2046). Similarly, the plane P1 also includes 1024 odd-numbered blocks (BLK1, 3, . . . , 2045, 2047).

Multiple NAND strings are formed in one block, and one NAND string includes multiple memory cells, bit line side selection transistors, source line side selection transistors, dummy cells, and the like. In addition, the NAND strings may be formed on the surface of a substrate in a two-dimensional array, or may be formed on the substrate in a three-dimensional array. In addition, a memory cell may be a single-level cell (SLC) that stores 1 bit, or a type that stores multiple bits.

The word line selection drive circuit 160 selects the block of the plane P0 and/or the block of the plane P1 based on the row address Ax, and then selects the word line of the selected block. It should be noted here that, when the word line selection drive circuit 160 operates the plane P0 and the plane P1 simultaneously, the blocks of the plane P0 and the plane P1 are separately selected, that is, the block of the plane P0 is selected based on the address related to the plane P0, and the block of the plane P1 is selected based on the address related to the plane P1. Furthermore, when the word line selection drive circuit 160 operates the plane P0 and the plane P1 simultaneously, the word line selection drive circuit 160 outputs the selection signal SGS/SGD corresponding to the operation of the plane P0 to the bit line side selection transistor/source line side selection transistor, and outputs the selection signal SGS/SGD corresponding to the operation of the plane P1 to the bit line side selection transistor/source line side selection transistor.

The ECC circuit 140 detects and corrects errors corresponding to programmed data or read data. The operation of ECC is performed by known methods such as Hamming code or Reed-Solomon code, and the input data Di of input k bits or k characters is converted into p=k+q; "q" is the error-correcting code or parity required for error detection and correction of the data.

Plane P0 is connected to page buffer/sensing circuit 170-0 and column selection circuit 180-0, and plane P1 is connected to page buffer/sensing circuit 170-1 and column selection circuit 180-1. Each NAND string of plane P0 is connected to a corresponding bit line through a bit line side selection transistor, and the bit line is connected to the page buffer/sensing circuit 170-0. Likewise, each NAND string of plane P1 is connected to a corresponding bit line through a bit line side selection transistor, and the bit line is connected to the page buffer/sensing circuit 170-1.

Figure 5A:
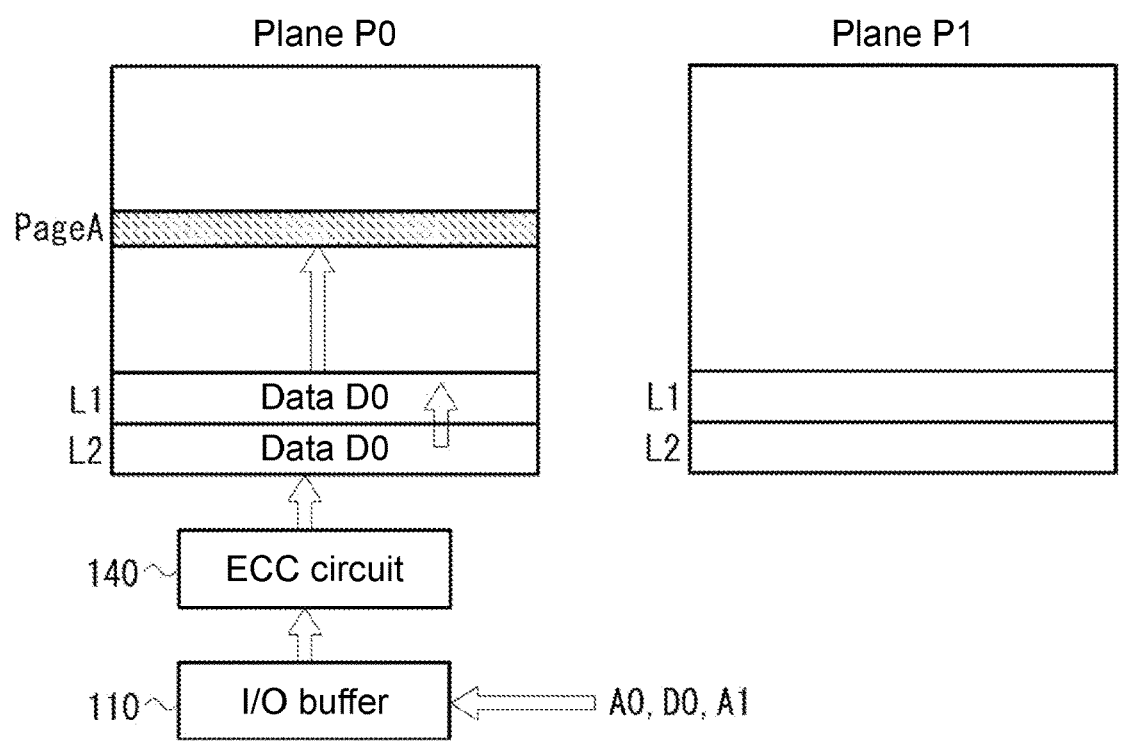
FIG. 5A and FIG. 5B are diagrams schematically illustrating multi-plane simultaneous operation according to the first embodiment.
Figure 5B:
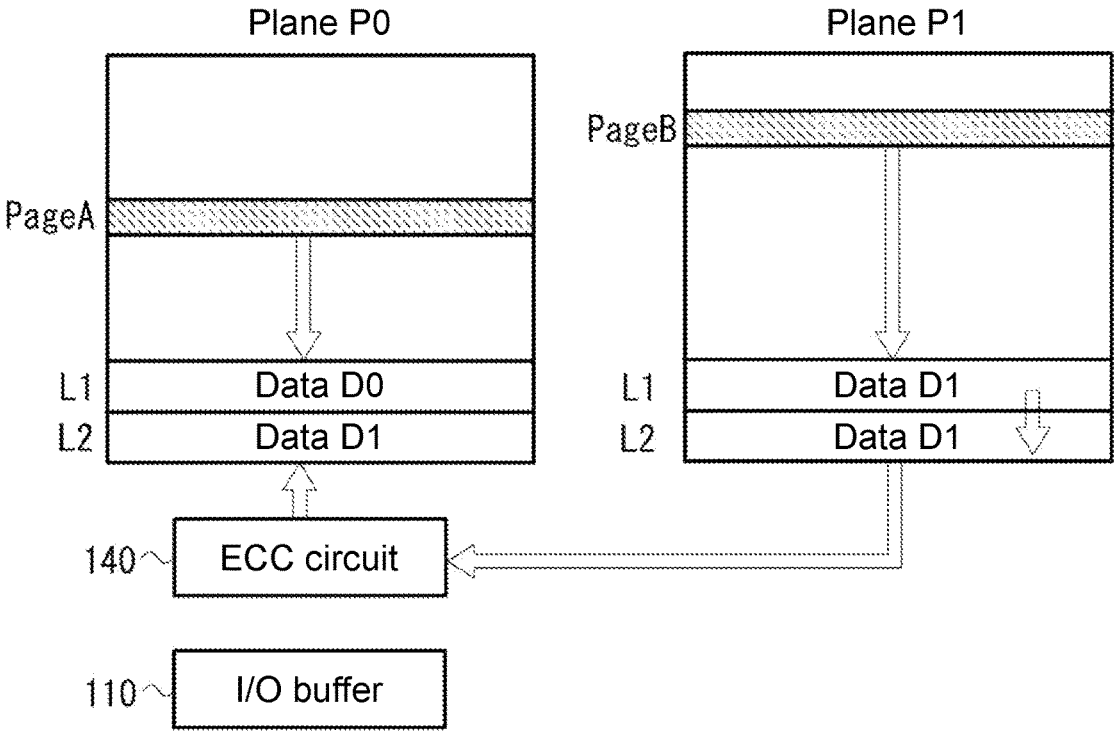

Each of the page buffer 170-0 and the page buffer 170-1 includes a first latch L1 capable of holding data of one page, and a second latch L2 capable of transmitting data with the first latch L1 (refer to FIG. 5A and FIG. 5B). Each latch L2 of the page buffer/sensing circuit 170-0 and the page buffer/sensing circuit 170-1 is connected to the I/O buffer 110, the ECC circuit 140, etc. through the internal bus 190, and the data transmission performed by the internal bus 190 is controlled by the transmission control unit 150. In a certain embodiment, the latch L1 and the latch L2 respectively include a first cache memory C0 and a second cache memory C1 that hold data in units of ½ pages, and the first cache memory C0 is configured in a manner capable of transmitting data independently of the second cache memory C1.

During the read operation of each plane, a certain positive voltage is applied to the bit line, a certain read voltage (for example, 0 V) is applied to the selected word line, and a read pass voltage Vpass is applied to the non-selected word line, the bit line side selection transistor and source line side selection transistor are turned on by the selection signal SGD/SGS, and OV is applied to the common source line. During the program operation, a high-voltage program voltage Vpgm is applied to the selected word line, an intermediate potential is applied to the non-selected word line, the bit line side selection transistor is turned on, the source line side selection transistor is turned off, and the voltage corresponding to the programmed data is applied to the bit line. During the erasing operation, 0 V is applied to the selected word line in the block, and the erasing voltage Vers is applied to the P-type well, and the data is erased on a block-by-block basis.

In the first embodiment of the present disclosure, the controller 130 may make the two planes P0 and P1 run simultaneously through the command added in this embodiment. Specifically, after the controller 130 receives a command to realize simultaneous operations on two planes (for convenience, the command is called a "simultaneous command"), program operation may be performed correspondingly on one plane and read operation is performed simultaneously on the other plane.

FIG. 4 is a flow chart showing multi-plane simultaneous operation according to the first embodiment of the present disclosure. FIG. 5A and FIG. 5B are diagrams schematically illustrating performing data transmission under multi-plane simultaneous operation. Here, an example shows that programming is performed on plane P0 and reading is performed on plane P1 simultaneously.

After the controller 130 receives a simultaneous command from the host side through the input/output buffer 110 (S100), a multi-plane simultaneous operation control sequence is initiated in response to the command. Regarding the simultaneous command, the address A0 and data D0 for programming of the plane P0 and the address A1 for reading of the plane P1 are input from the host side through the I/O buffer 110 (S110). Simultaneous commands may include two sets of commands capable of identifying the respective operations of plane P0 and plane P1. That is, it may have a simultaneous command_0 that identifies programming for plane P0 and reading for plane P1, and a simultaneous command_1 for that identifies reading for plane P0 and programming for plane P1. Alternatively, the operations performed by the plane P0 and the plane P1 may be identified by inputting two commands and their order or combination.

The input address A0 and the address A1 are held in the address register 120, and the address A0 and the address A1 are provided to the word line selection drive circuit 160 as well as the column selection circuit 180-0 and the column selection circuit 180-1. In addition, the input data D0 is transmitted to the ECC circuit 140 through the internal bus 190, and the ECC circuit 140 generates an error-correcting code. The generated error-correcting code and the data D0 are latched in the latch L2 of the page buffer/sensing circuit 170-0 of the plane P0 (S120).

On the other hand, the word line selection drive circuit 160 selects the block of the plane P0 based on the address A0 provided from the address register 120, and applies a program voltage to the selected word line, applies an intermediate voltage to the non-selected word line, the bit line side selection transistor is turned on, and the source line side selection transistor is turned off through the selection signal SGD/SGS. The data D0 held by the latch L2 is transmitted to the latch L1, and as a result, as shown in FIG. 5A, the data D0 is programmed into the selected page PageA of the plane P0 (S130).

In programming using increment step programming pulse (ISPP), verification reading is performed to verify whether the data "0" is correctly programmed into the memory cell. When it is determined that the programming is unacceptable, programming is performed by further applying a program voltage with an increased step voltage to the selected word line.

The controller 130 simultaneously controls the reading of the plane P1 while performing the verification reading of the plane P0. The word line selection drive circuit 160 selects the block of the plane P1 based on the address A1 provided from the address register 120, and applies a read voltage to the selected word line, applies a pass voltage to the non-selected word line, and the bit line side selection transistor and the source line side selection transistor are turned on through the selection signal SGD/SGS. As a result, while verification reading is performed, as shown in FIG. 5B, the selected page PageB of the plane P1 is read, and the read data D1 is held in the latch L1 (S140).

Next, the data D1 held by the latch L1 of the plane P1 is transmitted to the latch L2 in a manner asynchronous with the program operation of the plane P0, and the data D1 held by the latch L2 is transmitted to the ECC circuit 140 through the internal bus 190. The ECC circuit 140 performs error correction on the data D1 based on the error-correcting code (S150), and transmits the error-corrected data D1 to the latch L2 of the plane P0 (S160).

The data D1 held by the latch L2 may be programmed into the plane P0 when a new program command is input from the outside, or may be output as read data when a new read command is input from the outside, for example. In the case of programming described above, the data D1 may be read from the latch L2 of plane P1 to the ECC circuit 140, an error-correcting code may be generated in the same way as normal input data. The generated error-correcting code may be written back to the latch L2, or the data D1 read from the latch L2 of plane P1 can be programmed directly into plane P0 without being read by ECC circuit 140 if it has already been corrected by ECC circuit 140. In the latter case, the error correction code can be set to either default value or no value since data has already been corrected.

As described above, according to the present embodiment, when one plane is programmed, another plane may be read simultaneously, so that the processing efficiency of the flash memory may be improved. Furthermore, the multiplane flash memory of this embodiment may be applied to a neuromorphic chip.

Next, a second embodiment of the present disclosure will be described with reference to FIG. 6A and FIG. 6B. In the second embodiment, when performing reading according to the simultaneous command, the controller 130 controls to program the read data to the selected page of the plane P0 according to the internally generated command and address. The internal address is not particularly limited, and may be, for example, an address of a page adjacent to a selected page that has been programmed according to the simultaneous command. Under the circumstances, the word line selection drive circuit 160 generates an internal address by incrementing the row address input at the time of the simultaneous command by one using the internal address counter. In addition, in other examples, the internal address may be a page address, and the data read from the plane P1 are sequentially stacked in a predetermined block.

Figure 6A:
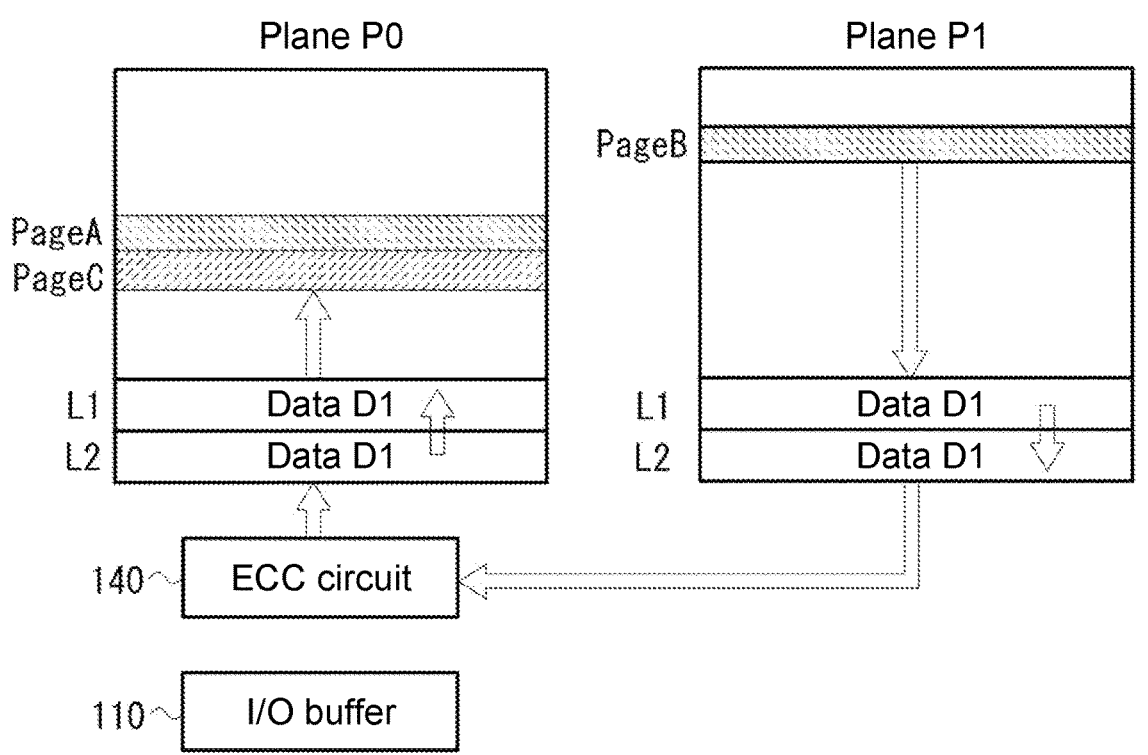
FIG. 6A and FIG. 6B are diagrams schematically illustrating multi-plane simultaneous operation according to a second embodiment of the present disclosure.
Figure 6B:
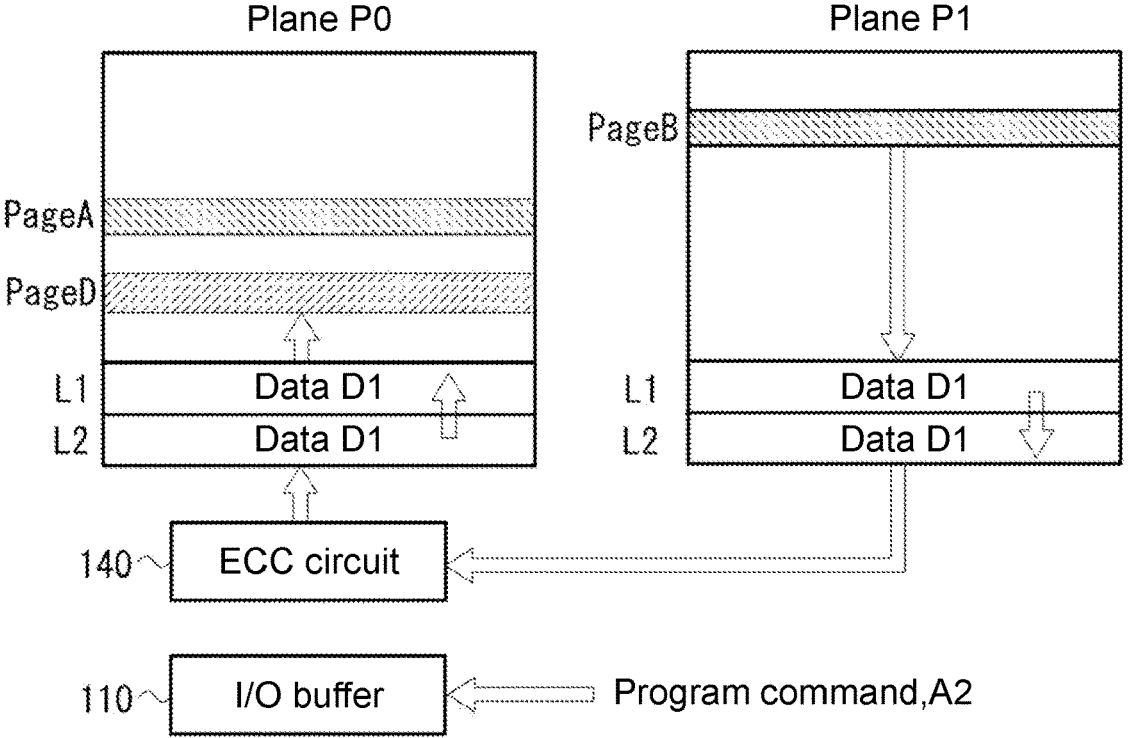

FIG. 6A shows an example of programming the data D1 read from the plane P1 to PageC adjacent to the selected page PageA of the plane P0 based on the internal address according to the simultaneous command.

In addition, in another embodiment, when the controller 130 inputs a new program command through the I/O buffer 110 after executing the simultaneous command, the data D1 held by the latch L2 may be programmed based on the internal address.

Furthermore, in another embodiment, when the controller 130 inputs a new program command and address through the I/O buffer 110 after executing the simultaneous command, the data D1 held by the latch L2 may be programmed to a selected page specified by an input address. FIG. 6B shows an example of programming the data D1 to the selected page PageD specified by the address A2 when a new program command and the address A2 are input from the I/O buffer 110.

As described above, according to the present embodiment, data read from one plane may be programmed to another plane by simultaneous commands without being output to the outside, thus improving the processing efficiency of the flash memory.

Figure 7A:
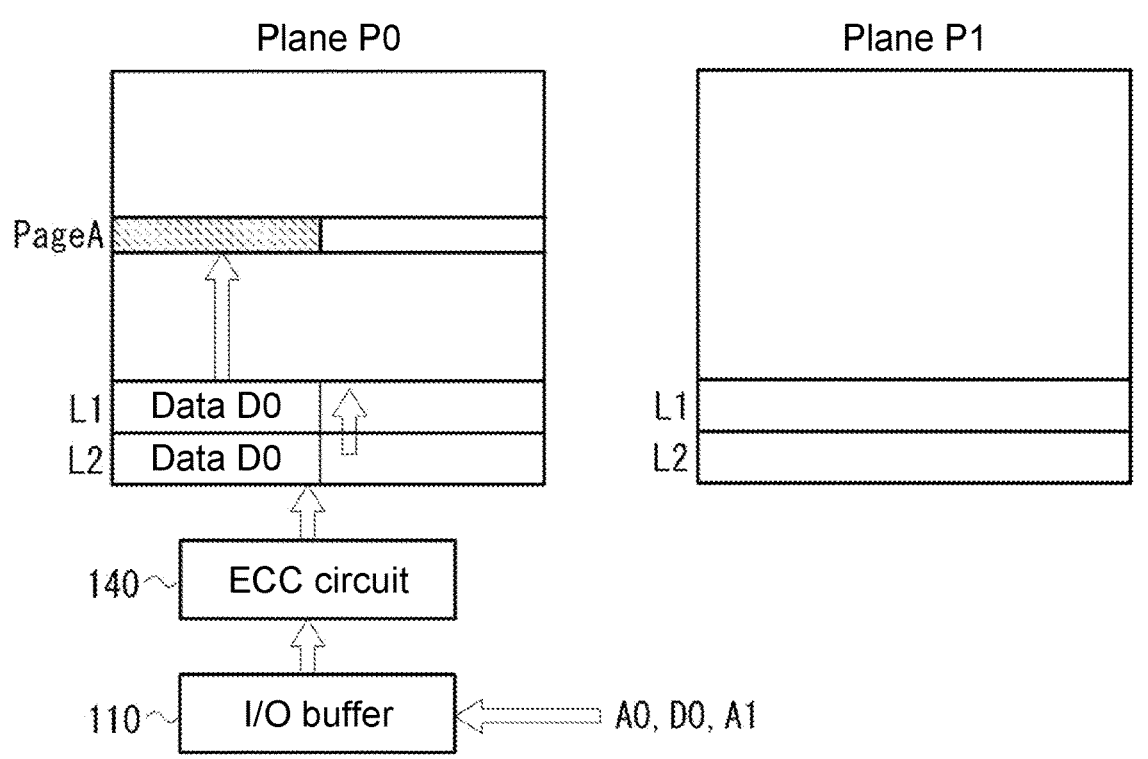
FIG. 7A and FIG. 7B are diagrams schematically illustrating multi-plane simultaneous operation according to a third embodiment of the present disclosure.
Figure 7B:
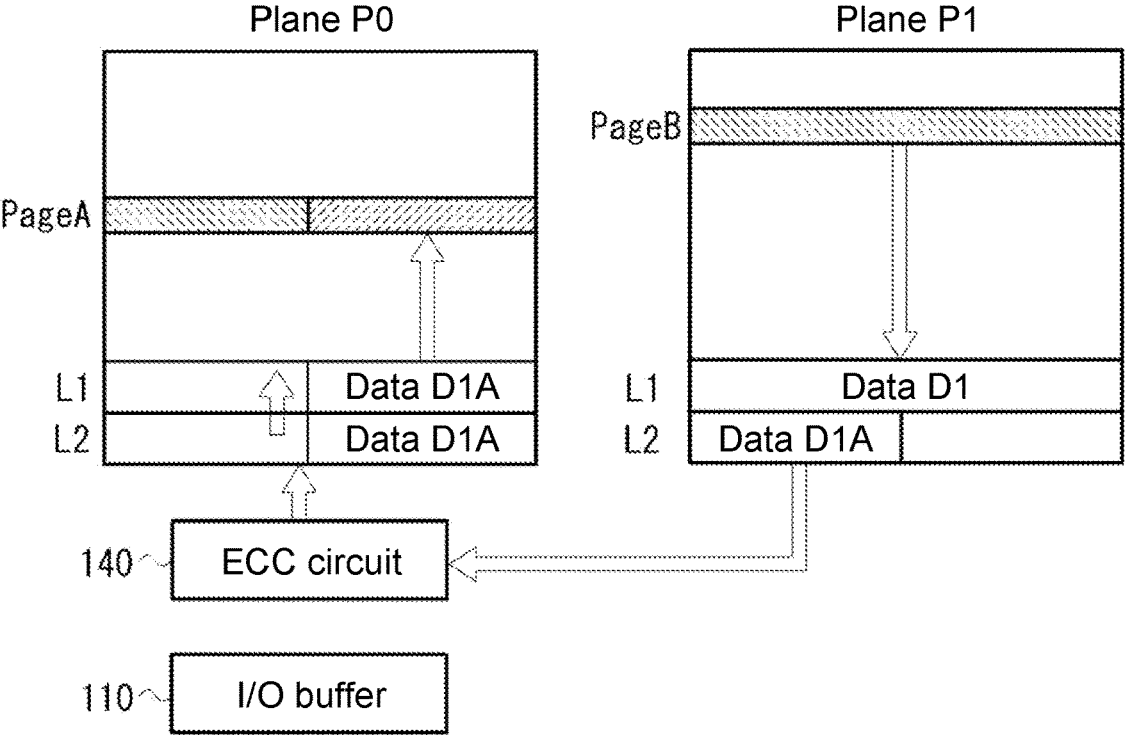

Next, a third embodiment of the present disclosure will be described with reference to FIG. 7A and FIG. 7B. The third embodiment enables partial writing to selected pages. FIG. 7A shows an example of programming data D0 of less than 1 page size (the drawing shows data of ½ page) to the selected page PageA of plane P0 by a simultaneous command. FIG. 7B shows an example in which a part of data DIA of data D1 read from the selected page PageB of plane P1 is transmitted to the latch L2 of plane P0 by a simultaneous command, and then programmed to the selected page PageA according to the internal address.

As described above, according to this embodiment, the data read from the plane may be programmed to the same selected page as the selected page programmed by the simultaneous command according to the simultaneous command, thereby enhancing the convenience of the flash memory.

Figure 9A:
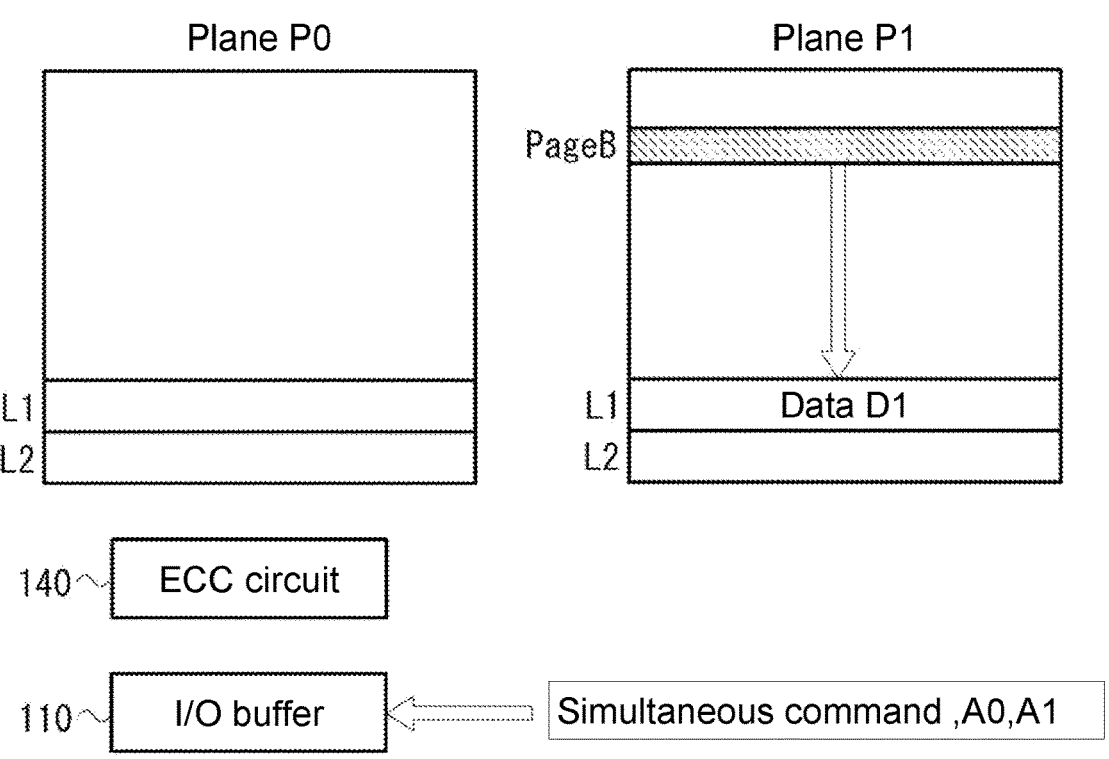
FIG. 9A and FIG. 9B are diagrams schematically illustrating multi-plane simultaneous operation according to a fourth embodiment of the present disclosure.
Figure 9B:
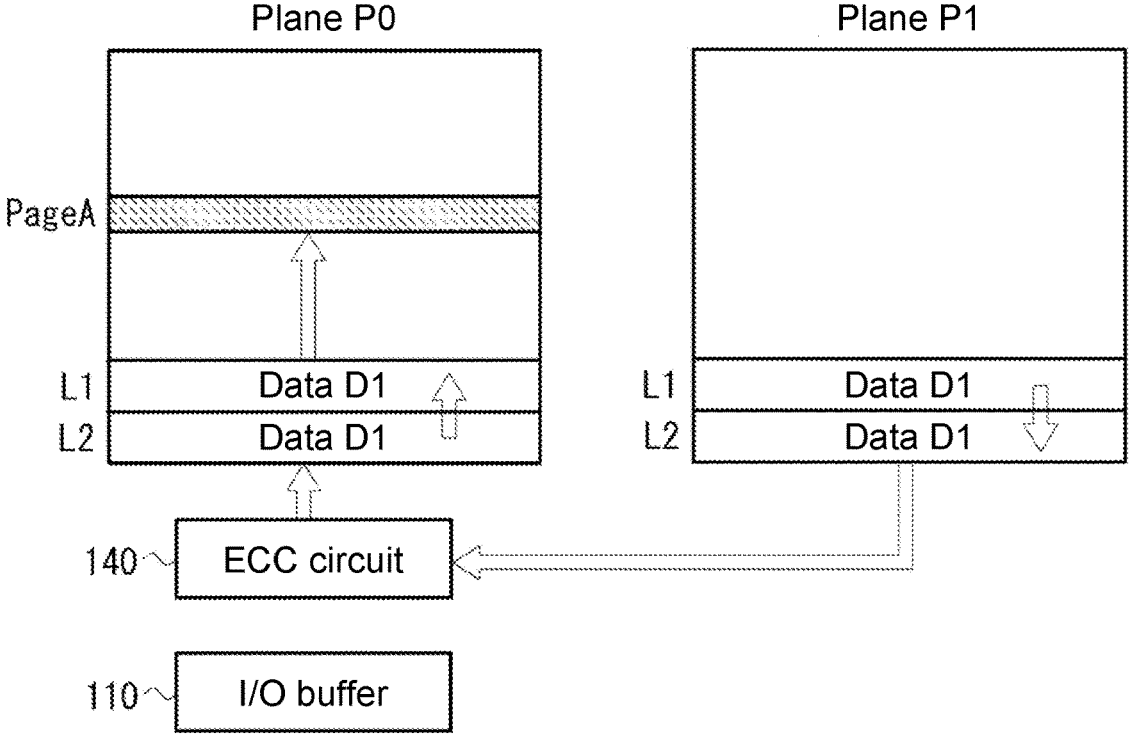

Next, a fourth embodiment of the present disclosure is described below. The fourth embodiment may use one command to move data across planes. FIG. 8 shows the operation flow of the simultaneous command in the fourth embodiment, and FIG. 9A and FIG. 9B are diagrams schematically illustrating the operation of the simultaneous command. Here, an example shows that programming is performed on plane P0 and reading is performed on plane P1 simultaneously.

After the controller 130 receives a simultaneous command from the host side through the I/O buffer 110 (S200), a multi-plane simultaneous operation control sequence is initiated in response to the command. The control sequence first performs a read operation, and then performs a program operation.

After the address A0 for programming of plane P0 and the address A1 for reading of plane P1 are input from the host side through the I/O buffer 110 (S210), address A0 and address A1 are held in the addresses register 120. During the read operation and the program operation, the address A0 and the address A1 are provided to the word line selection drive circuit 160 as well as the column selection circuit 180-0 and the column selection circuit 180-1.

When performing a read operation on the plane P1, the word line selection drive circuit 160 selects a block of the plane P1 based on the address A1 provided from the address register 120, and applies a read voltage to the selected word line, applies a read pass voltage to the non-selected word line, and the bit line side selection transistor and the source line side selection transistor are turned on through the selection signal SGD/SGS. As a result, as shown in FIG. 9A, the selected page PageB of the plane P1 is read, and the read data D1 is held in the latch L1 (S220).

Next, the data D1 held by the latch L1 of the plane P1 is transmitted to the latch L2, and the data D1 held by the latch L2 is transmitted to the ECC circuit 140 through the internal bus 190. The ECC circuit 140 performs error correction on the data D1 based on the error-correcting code (S230), and transmits the error-corrected data D1 to the latch L2 of the plane P0 (S240).

Next, the data D1 held by the latch L2 is latched in the latch L1, and in addition, the word line selection drive circuit 160 selects the block of the plane P0 based on the address A0 provided from the address register 120, and applies a program voltage to the selected word line, applies an intermediate voltage to the non-selected word line; the bit line side selection transistor is turned on, and the source line side selection transistor is turned off through the selection signal SGD/SGS. In this manner, as shown in FIG. 9B, the data D1 is programmed to the selected page PageA of the plane P0 (S250).

Here, the address A0 of the selected page PageA used to specify the plane P0 is input from the outside. For example, when the read data read from the plane P1 is sequentially stored in a predetermined block, the selected page may be specified according to the internal address generated by the internal address counter without inputting the address A0.

As described above, according to this embodiment, the data read from one plane is programmed to another plane without being output to the outside, so data transmission across planes may be performed at a higher speed, and it is possible to reduce the load on the host side.

In the above-described embodiment, a flash memory including two planes is exemplified, but the number of planes is not limited to two, and may be three or more. For example, when the number of planes is three, when a certain plane is programmed, any plane may be read during the verification reading operation. In addition, the data read from one plane may be programmed to any other plane, and the data transmission between planes may be performed. When the number of planes is three or more, plane selection is performed based on input column addresses, for example.

In the above-described embodiments, an example in which the flash memory is equipped with an ECC circuit is shown, which is merely illustrative. The flash memory does not necessarily need to be equipped with an on-chip ECC circuit, and the host side may also be equipped with an ECC function.

Preferred embodiments of the present disclosure have been described in detail, but the present disclosure is not limited to specific embodiments, and various modifications and changes may be made within the scope of the gist of the present disclosure described in the claims.

What is claimed is:

1. A memory device, having:
   a memory cell array, comprising a first plane and a second plane;
   a control circuit, configured to control a read operation of the second plane and a program operation of the first plane;
   a first data holding circuit, configured to hold data read from or to be programmed to the first plane; and
   a second data holding circuit, configured to hold data read from or to be programmed to the second plane,
   wherein the control circuit controls read data read from the second plane to be held in the second data holding circuit, and transmits the read data held by the second data holding circuit to the first data holding circuit in response to a simultaneous command input from the outside, and wherein the control circuit is configured to, in response to the simultaneous command, perform the read operation of the second plane while performing the program operation of the first plane.

2. The memory device according to claim 1, wherein the control circuit simultaneously performs an array reading operation of the second plane while performing a verification reading operation of the first plane.

3. The memory device according to claim 1, wherein the control circuit programs a selected page of the first plane and reads a selected page of the second plane according to an address input from the outside related to the simultaneous command.

4. The memory device according to claim 1, wherein
   the memory device further comprises an error-correcting code (ECC) circuit, which performs error detection and correction on data,
   the ECC circuit performs error detection and correction on the read data held by second data holding circuit and transmitted from the second data holding circuit, and completes the transmitting of the read data to the first data holding circuit by transmitting an error-corrected version of read data to the first data holding circuit.

5. The memory device according to claim 1, wherein
   the control circuit programs the read data held by the first data holding circuit to the first plane.

6. The memory device according to claim 1, wherein the control circuit programs the read data to a page adjacent to a selected page when programming to the first plane.

7. The memory device according to claim 1, wherein the control circuit programs the read data according to an address input from the outside.

8. The memory device according to claim 1, wherein the control circuit programs the read data in response to a program command internally generated.

9. The memory device according to claim 1, wherein the control circuit programs the read data in response to a program command input from the outside.

10. The memory device according to claim 1, wherein the control circuit programs the read data to a same selected page as the selected page programmed by a simultaneous command when programming to the first plane.

11. The memory device according to claim 1, wherein in response to the simultaneous command, a write address, a write data and a read address are input from the outside, and the control circuit programs a selected page of the first plane according to the write address and the write data and reads a selected page of the second plane according to the read address, wherein the write data is different from the read data.

12. The memory device according to claim 11, wherein the control circuit reads the selected page of the second plane according to the read address while programming another selected page of the first plane according to an internal write address.

13. A memory device, comprising:
   a memory cell array, which at least comprises a first plane and a second plane;
   a control circuit, configured to control a read operation of the second plane and a program operation of the first plane;
   a first data holding circuit, configured to hold data read from or to be programmed to the first plane; and
   a second data holding circuit, configured to hold data read from or to be programmed to the second plane, wherein the control circuit is configured to program read data read from the second plane to the first plane in response to a simultaneous command input from the outside, and wherein the control circuit is configured to, in response to the simultaneous command, perform the read operation of the second plane while performing the program operation of the first plane.

14. The memory device according to claim 13, wherein the control circuit programs the read data to a selected page of the first plane according to an address input from the outside and related to the simultaneous command.

15. The memory device according to claim 13, wherein the control circuit programs the read data to a selected page of the first plane according to an address internally generated.

16. An operating method of a memory device, wherein the memory device comprises a memory cell array, a first data holding circuit and a second data holding circuit, the memory cell array comprises a first plane and a second plane, and the operating method comprises:

controlling a read operation of the second plane and a program operation of the first plane;

holding, by the first data holding circuit, data read from or to be programmed to the first plane;

holding, by the second data holding circuit, data read from or to be programmed to the second plane; and operating the first plane and the second plane simultaneously in response to a simultaneous command input from the outside, by holding read data read from the second plane in the second data holding circuit, transmitting the read data held by the second data holding circuit to the first data holding circuit, and performing the read operation of the second plane while performing the program operation of the first plane.

17. The operating method according to claim 16, further comprising:

simultaneously performing an array reading operation of the second plane while performing a verification reading operation of the first plane.

18. The operating method according to claim 16, wherein operating the first plane and the second plane simultaneously in response to the simultaneous command input from the outside comprises:

programming a selected page of the first plane and reads a selected page of the second plane according to an address input from the outside related to the simultaneous command.

19. The operating method according to claim 16, wherein operating the first plane and the second plane simultaneously according to the simultaneous command input from the outside comprises:

programming the read data to a selected page of the first plane according to an address input from the outside and related to the simultaneous command.

20. The operating method according to claim 16, wherein operating the first plane and the second plane simultaneously in response to the simultaneous command input from the outside comprises:

programming the read data to a selected page of the first plane according to an address internally generated.

* * * * *